United States Patent [19]

Cohen et al.

[11] Patent Number: 4,528,582
[45] Date of Patent: Jul. 9, 1985

[54] INTERCONNECTION STRUCTURE FOR POLYCRYSTALLINE SILICON RESISTOR AND METHODS OF MAKING SAME

[75] Inventors: Simon S. Cohen, Schenectady; Mario Ghezzo, Ballston Lake, both of N.Y.

[73] Assignee: General Electric Company, Schenectady, N.Y.

[21] Appl. No.: 534,520

[22] Filed: Sep. 21, 1983

[51] Int. Cl.³ .................... H01L 27/02; H01L 29/04; H01L 23/48
[52] U.S. Cl. ......................... 357/51; 357/59; 357/67; 357/71; 357/50
[58] Field of Search ............ 357/71 P, 71 S, 51, 357/67 S, 59, 50

[56] References Cited

U.S. PATENT DOCUMENTS

| 3,570,114 | 3/1971 | Bean | 357/59 |
|---|---|---|---|
| 3,597,834 | 8/1971 | Lathrop | 357/71 S |
| 3,617,824 | 11/1971 | Shinoda et al. | 357/71 S |
| 3,777,364 | 12/1973 | Schinella et al. | 357/71 S |
| 3,900,344 | 8/1975 | Magdo | 357/71 S |
| 3,939,047 | 2/1976 | Tsunemitsu | 357/71 S |
| 4,329,706 | 5/1982 | Crauder et al. | 357/71 S |
| 4,370,798 | 2/1983 | Lien et al. | 357/59 |

FOREIGN PATENT DOCUMENTS

| 75984 | 7/1974 | Japan | 357/71 S |
|---|---|---|---|
| 53452 | 4/1980 | Japan | 357/71 S |
| 134964 | 10/1980 | Japan | 357/71 S |
| 16577 | 10/1980 | Japan | 357/71 S |
| 18463 | 2/1981 | Japan | 357/67 S |
| 161668 | 12/1981 | Japan | 357/71 S |
| 56958 | 4/1982 | Japan | 357/71 S |

OTHER PUBLICATIONS

IBM Tech. Disclosure Bulletin, vol. 23, #6, Nov. 1980, by Rideout, pp. 2563–2566.
IBM Technical Disclosure Bulletin, vol. 21, #12, 5/79, "Fabrication of Vias in a Multilayered Metalization in LSI Tech.".
IBM Technical Disclosure Bulletin, vol. 17, #6, 11/74, "Nickel-Silicide Barriers to Improve Ohmic Contacts".
Journal of Vacuum Science Tech., vol. 17, #4, Jul., 80, "General Physical Properties-Selection of Silicides", p. 776.

Primary Examiner—Andrew J. James
Assistant Examiner—Mark Prenty
Attorney, Agent, or Firm—Marvin Snyder; James C. Davis, Jr.

[57] ABSTRACT

End portions of a polycrystalline silicon resistor are bonded to conductive members of silicon of low resistivity through a silicide of a suitable metal such as platinum.

6 Claims, 7 Drawing Figures

INTERCONNECTION STRUCTURE FOR POLYCRYSTALLINE SILICON RESISTOR AND METHODS OF MAKING SAME

The present invention relates, in general, to interconnection structures for polycrystalline silicon resistors and particularly to such structures in integrated circuit devices for connecting polycrystalline silicon resistors to conductive members of silicon semiconductor material.

In an integrated circuit polycrystalline silicon resistors consisting of a lightly doped member of polycrystalline silicon are connected to heavily doped regions of a silicon substrate or to conductive lines of heavily doped polycrystalline silicon material. Since both the lightly and heavily doped regions or members are made of the same element, silicon, migration of dopant from the more heavily doped region to the lightly doped region occurs in the process of establishing thermodynamic equilibrium in the materials. This migration is enhanced during subsequent heat treatments to which the integrated circuit is subjected. This migration also occurs over time depending upon the environments to which the integrated circuit is subjected. Thus, the quality of the integrated circuit device utilizing the polycrystalline silicon resistor deteriorates over a period of time. Also, as the differently doped members of polycrystalline silicon and silicon usually have different metallurgical properties, such as different grain sizes, and as silicon includes a thin layer of native oxide, irregularities in the properties of the lightly doped to heavily doped interface occurs.

A principal object of the present invention is the provision of interconnection structures for polycrystalline silicon resistors and a method of making same that can withstand high temperatures and long time usage without significant deterioration in the resistivity of the resistors.

Another object of the present invention is to provide interconnection structures for polycrystalline silicon resistors of substantially uniform properties.

In carrying out the method of the present invention in accordance with one embodiment thereof, a substrate of silicon semiconductor material is provided. A first layer of an insulating material is formed thereon. A pair of conductive members of polycrystalline silicon of one conductivity type and of a first resistivity are formed on the first layer of insulating material. A second layer of an insulating material is deposited on said conductive members and said first insulating member. A pair of openings are formed in the second layer of insulating material, each opening exposing a respective portion of the conductive members. A layer of a metal selected from the group consisting of platinum, palladium and nickel is formed in each of the openings with each of the layers making contact with a respective exposed portion of the conductive members. A body of polycrystalline silicon of said one conductivity type and of a second resistivity substantially greater than said first resistivity is formed on the second insulating member. The body of polycrystalline silicon has a pair of end portions, each of which makes contact with a respective one of the layers of metal. The conductive members and the body of polycrystalline silicon are heated at a temperature and for a time to bond the conductive members and the body of polycrystalline silicon to the layers of metal. Thus, an interconnection structure is formed in which the end portions of a polycrystalline silicon resistor are connected to silicon members more heavily doped through a respective conductive barrier layer. Such structure blocks diffusion of dopants from the more heavily doped conductive members to the more lightly doped resistor.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
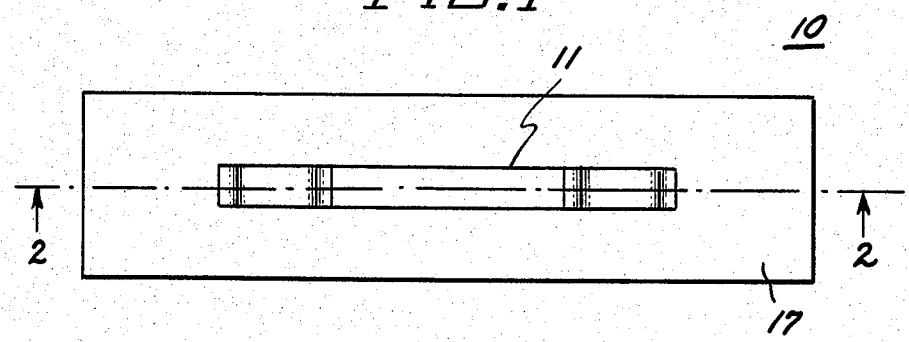
FIG. 1 is a plan view of a composite body including an insulating substrate on which is formed a polycrystalline silicon resistor and a pair of polycrystalline silicon conductive members to which end portions of the resistor are connected.
Figure 2:
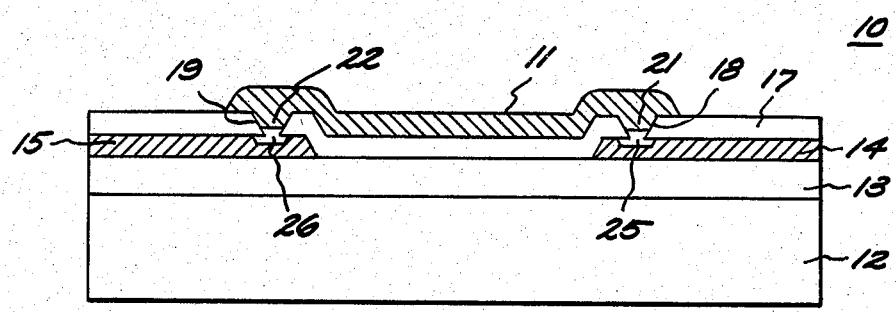
FIG. 2 is a cross sectional view of the body of FIG. 1 taken along section lines 2—2 thereof.

Referring now to FIGS. 1 and 2, there is shown a composite body including an insulating substrate on which is formed a polycrystalline silicon resistor and a pair of polycrystalline silicon conductive members to which the end portions of the resistor are connected. The composite body 10 includes a substrate 12 of silicon semiconductor material on which a layer 13 of silicon dioxide has been formed. Overlying the insulating layer are a pair of conductive members 14 and 15 of polycrystalline silicon heavily doped to provide high conductivity. Overlying the conductive members 14 and 15 and the insulating member 13 is a second layer 17 of silicon dioxide. The second layer 17 of silicon dioxide includes a pair of openings 18 and 19 exposing a portion of conductive members 14 and 15, respectively. Overlying the second insulating member 17 is a body 11 of polycrystalline semiconductor material of high resistivity constituting a resistor. The body 11 has end portions 21 and 22 extending into openings 18 and 19. In the openings are situated conductive barrier layers 25 and 26. The end portion 21 of body 11 makes contact with one side of the barrier layer 25, the other side of which is included in the polycrystalline silicon conductive member 14. The end portion 22 of body 11 makes contact with one side of barrier layer 26, the other side of which is included in the polycrystalline silicon conductive member 15. The conductive barrier layers 25 and 26 are formed by the inclusion of a suitable metal such as platinum in the openings 18 and 19 and thereafter heating the polycrystalline silicon members 14, 15 and 11 for a time and at a temperature to form layers of platinum silicide 25 and 26 bonded to the end portions of the resistive body 11 and to the conductive members 14 and 15 thereby forming good conductive contact therebetween while providing a barrier to the diffusion of dopants from the more heavily doped conductive members 14 and 15 into the resistive body 11.

Figure 3A:
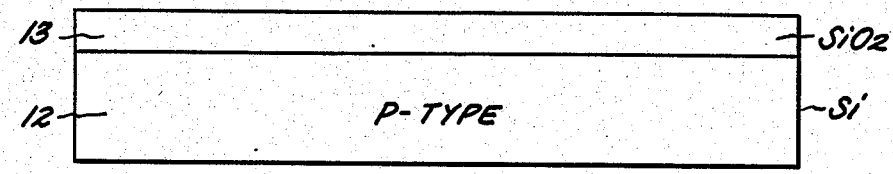
FIGS. 3A-3E show cross sections of structures representing successive steps in one method of fabricating the composite structure of FIG. 1 in accordance with the present invention.
Figure 3B:
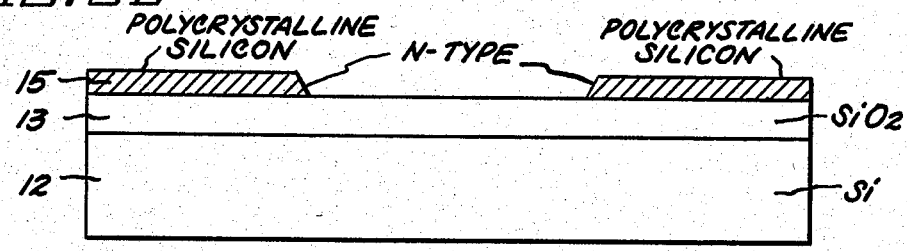
Figure 3C:
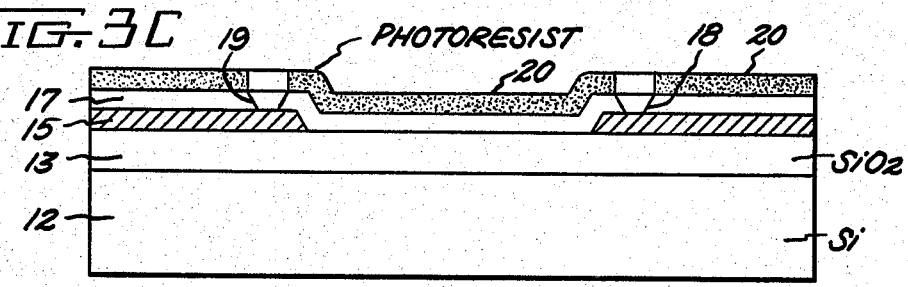
Figure 3D:
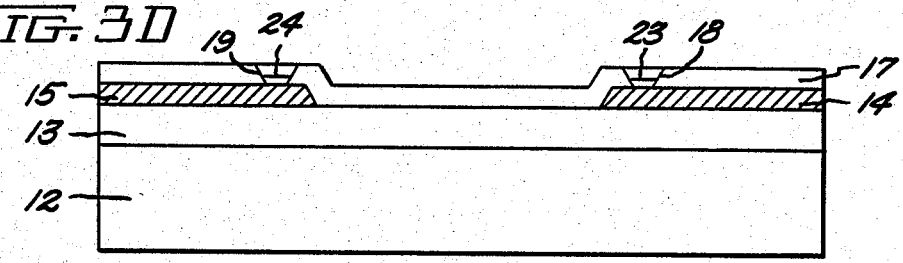
Figure 3E:
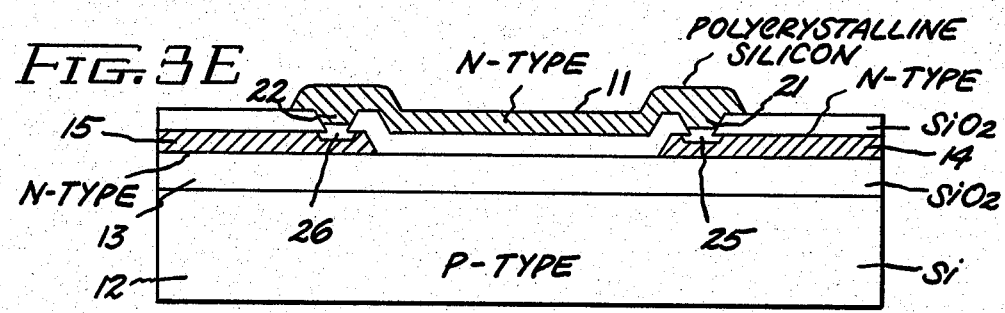

A method of fabricating the composite structure of FIGS. 1 and 2 will now be described in connection with FIGS. 3A-3E. The elements of FIGS. 3A-3E which are identical to the elements of FIGS. 1 and 2 are identically designated. A substrate of P-type silicon semiconductor material about 15 mils thick, having a resistivity of 10 ohms-cm, for example, and having a major surface parallel to the (100) plane of the crystal is provided. The substrate is cleaned and thereafter oxidized at 1000° C. in wet oxygen to grow thereon a layer of silicon dioxide 5000 Angstroms thick, as shown in FIG. 3A. A layer of polycrystalline silicon is deposited by a low pressure pyrolytic decomposition of silane on the layer 13 of silicon dioxide and doped with a suitable N-type dopant such as phosphorus or arsenic to provide high conductivity therein. The layer of polycrystalline silicon is then patterned into conductive members 14 and 15 using conventional photolithographic masking and etching techniques as shown in FIG. 3B. A layer 17 of silicon dioxide 1000 Angstroms thick is chemically vapor deposited on the polycrystalline silicon conductive members 14 and 15 and on the exposed surface of the layer 13 of silicon dioxide 13 by conventional means such as by the reaction of silane with oxygen. A layer 20 of a suitable photoresist is then deposited on the layer 17 of silicon dioxide and patterned to provide a pair of apertures therein in registration and overlapping the ends of conductive members 14 and 15. The photoresist with the apertures is utilized as a mask for etching of the openings 18 and 19 in the silicon dioxide layer 17 which expose portions of the polycrystalline silicon conductive members 14 and 15, as shown in FIG. 3C. A layer of a suitable metal such as platinum is sputter deposited over the layer of photoresist and in the openings 18 and 19 to a thickness of about 500 Angstroms. Thereafter, the photoresist is removed along with the platinum deposited on the surface thereof leaving platinum layers 23 and 24 in the openings 18 and 19 contacting respective conductive members 14 and 15 as shown in FIG. 3D. A layer of polycrystalline silicon 2000 Angstroms thick is deposited over the layer of silicon dioxide 17 and into the openings 18 and 19 contacting respective platinum layers 23 and 24 therein. The layer of polycrystalline is suitably doped with an N-type dopant such as arsenic, to provide the proper resistivity therein. The layer of doped polycrystalline silicon is then patterned by suitable photolithographic masking and etching techniques to form the resistive body 11. The resistivity of the body 11 and the geometric proportions thereof are set to provide the body with the desired resistance. Thereafter, the body 11, the conductive members 14 and 15 of polycrystalline silicon, and the layers of platinum 23 and 24 in the openings 18 and 19 are heated to a temperature of about 900° C. for a time to sinter the layers of platinum 23 and 24 into respective layers of platinum silicide 25 and 26 as shown in FIG. 3E. The platinum silicide layer 25 is bonded to the end portion 21 of the polycrystalline silicon body 11 and on the other side bonded to a surface portion of the conductive member 14. The platinum silicide 26 is bonded on one side to end portion 22 of the body 11 and the other side is bonded to a surface portion of the conductive member 15. The platinum silicide barrier layers 25 and 26 provide good contact between the end portions 21 and 22 of the body 11 and respective conductive members 25 and 26 while providing a barrier to the diffusion of N-type impurities in the more heavily doped conductive members 14 and 15 into the more lightly doped end portions 21 and 22, respectively, of the body 11.

While in the process described above, the platinum silicide members 25 and 26 are bonded by sintering to the conductive members 14 and 15 and also to the resistive body 11, the platinum layers 23 and 24 may be initially sintered to the conductive members 14 and 15 and thereafter the resistive body 11 may be formed thereon making contact with the platinum silicide members 25 and 26 with or without a thermal bonding thereto.

While the platinum layers 23 and 24 were formed in the openings 18 and 19 in the process described above using a photoresist lift-off technique, the platinum may be deposited over the layer of silicon dioxide and into the openings 18 and 19 making contact with the conductive members 14 and 15 and reacted therewith to provide platinum silicide members 25 and 26 bonded to the conductive members 14 and 15, respectively. Thereafter, platinum may be etched using aqua regia and leaving only platinum silicide in the openings 18 and 19. Thereafter, the body of polycrystalline silicon is formed thereon as in the process described above.

While platinum was the metal used for the layers 23 and 24, other metals, such as palladium and nickel, may be utilized. These metals are sintered to the polycrystalline silicon members 14, 15 and 11 thereby forming conductive barrier layers of a silicide of these metals.

While in the process described above, the resistive body 11 of polycrystalline is bonded to polycrystalline silicon conductive members 14 and 15, either one or both of the polycrystalline silicon conductive members 14 and 15 may be regions in a substrate of monocrystalline silicon of high conductivity.

While in connection with FIGS. 1 and 2 a structure has been described in which conductive members 14 and 15 overlie a continuous insulating layer 13, it is understood that an opening might be made in this insulating layer in alignment with one of the contact openings 18 or 19 to provide a contact of one of the conductive members 14 and 15 to the surface of the silicon substrate 12.

While in connection with the structure of FIGS. 1 and 2 the conductive members 14 and 15 were constituted of heavily doped polycrystalline silicon, these conductive members could be constituted of a layer of heavily doped polycrystalline silicon over which is included a layer of a conductive silicide, such as titanium silicide, which may not provide a barrier to the diffusion of dopants from the conductive members to the body 11 of lightly doped polycrystalline silicon. In such a case a barrier layer such as platinum silicide would be provided between the bi-layer conductive members and the lightly doped body 11 of polycrystalline silicon.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:
1. In combination,
   a pair of conductive members of silicon semiconductor material of N-type conductivity and of low resistivity,
   a layer of insulating material overlying said conductive members of silicon,
   a pair of openings in said layer of insulating material exposing respective portions of said conductive members of silicon,
   a pair of conductive barrier layers, each barrier layer constituted of a silicide of a metal selected from the group consisting of platinum, palladium and nickel, each barrier layer situated in a respective one of said openings and each making contact with a respective exposed portion of said conductive members, a body of polycrystalline silicon of said N-type conductivity and of high resistivity overlying said insulating layer and having a pair of end portions, each end portion contacting a respective one of said barrier layers, each conductive barrier layer providing a barrier to the diffusion of N-type conductivity determining dopants from said conductive members of silicon into said body of polycrystalline silicon.

2. The combination of claim 1 in which one of said conductive members is a region in a monocrystalline silicon substrate.

3. The combination of claim 1 in which both of said conductive members are regions in a monocrystalline silicon substrate.

4. The combination of claim 1 in which both of said conductive members are constituted of polycrystalline silicon.

5. The combination of claim 1 in which said insulating material is silicon dioxide.

6. The combination of claim 1 in which the composition of said conductive barrier is platinum silicide.

* * * * *